United States Patent [19]

Totsuka et al.

[11] Patent Number: 4,834,540
[45] Date of Patent: May 30, 1989

[54] PROJECTION EXPOSURE APPARATUS

[75] Inventors: Masao Totsuka, Ohmiya; Akiyoshi Suzuki, Tokyo; Hideki Ina, Kawasaki, all of Japan

[73] Assignee: Canon Kabushiki Kaisha, Tokyo, Japan

[21] Appl. No.: 69,225

[22] Filed: Jul. 2, 1987

[30] Foreign Application Priority Data

Jul. 4, 1986 [JP] Japan .................................. 61-156242

[51] Int. Cl.$^4$ .......................... G01D 11/00; G01J 1/00
[52] U.S. Cl. ................................. 356/401; 250/491.1
[58] Field of Search ................. 250/491.1; 378/34, 35; 356/400, 401

[56] References Cited

U.S. PATENT DOCUMENTS

| | | | |
|---|---|---|---|
| 4,487,505 | 12/1984 | Nakane et al. | 356/401 |
| 4,528,452 | 7/1985 | Livesay | 250/491.1 |
| 4,579,453 | 4/1986 | Makita | 356/401 |
| 4,595,295 | 6/1986 | Wilczynski | 356/401 |
| 4,629,313 | 12/1986 | Tanimoto | 356/401 |
| 4,652,134 | 3/1987 | Pasch et al. | 356/401 |
| 4,655,598 | 4/1987 | Murakami et al. | 356/401 |
| 4,663,534 | 5/1987 | Ayata et al. | 356/401 |
| 4,668,089 | 5/1987 | Oshida et al. | 356/401 |
| 4,705,956 | 11/1987 | Ward | 250/491.1 |

FOREIGN PATENT DOCUMENTS

| | | |
|---|---|---|
| 53-90955 | 8/1978 | Japan . |
| 54-53562 | 4/1979 | Japan . |
| 58-25638 | 2/1983 | Japan . |
| 60-52021 | 3/1985 | Japan . |

*Primary Examiner*—Bruce C. Anderson
*Attorney, Agent, or Firm*—Fitzpatrick, Cella, Harper & Scinto

[57] ABSTRACT

A projection exposure apparatus for projecting a pattern, formed on a reticle, upon a wafer by way of a projection lens system is disclosed. The apparatus includes an alignment system wherein light is projected upon an alignment mark of the wafer by use of the projection lens system, and the light diffracted by an edge of the wafer alignment mark is guidingly directed from between the projection lens system and the wafer to a photoelectric detector without intervention of the projection lens system. From the photodetector, an alignment signal corresponding to the position of the wafer alignment mark is obtained and, on the basis of the alignment mark signal, the wafer and the reticle are brought into a predetermined positional relation. With the disclosed alignment system, the wafer alignment mark can be detected without being affected by a photoresist layer applied to the wafer surface, with the result that the reticle and the wafer can be aligned more accurately.

16 Claims, 6 Drawing Sheets

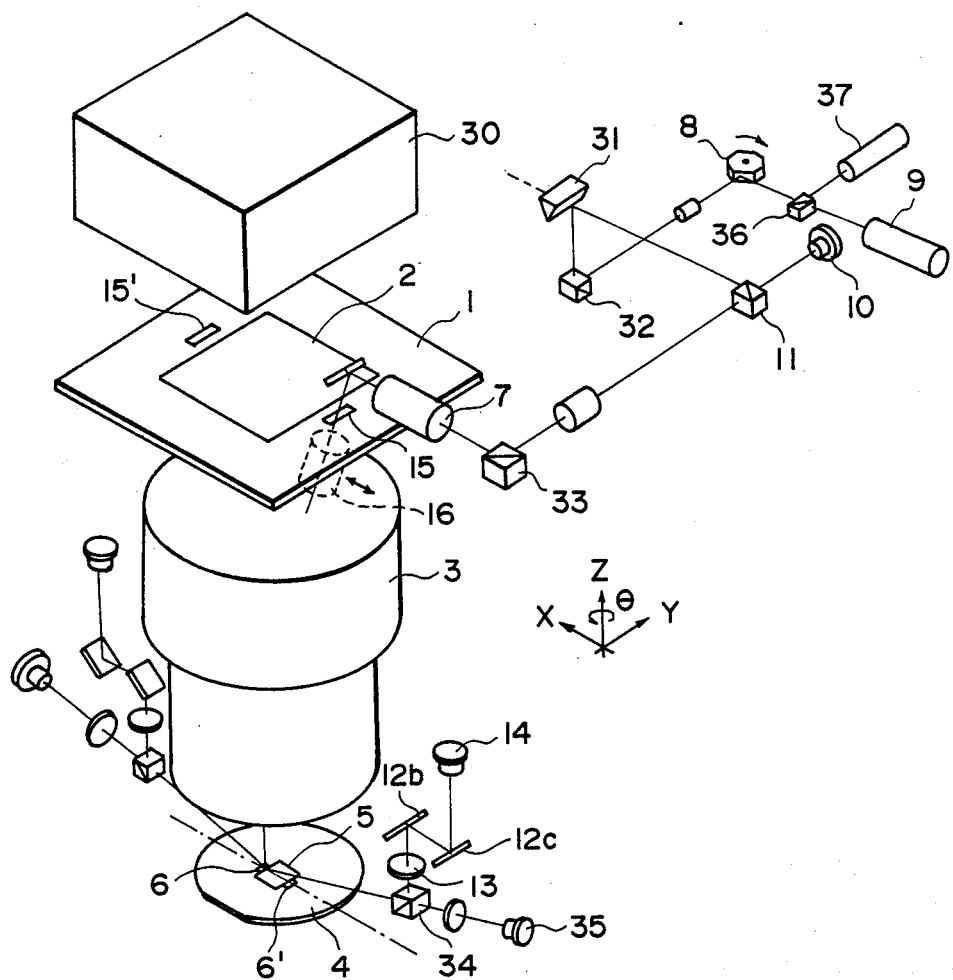
F I G. 4

PROJECTION EXPOSURE APPARATUS

FIELD OF THE INVENTION AND RELATED ART

This invention relates generally to a projection exposure apparatus for optically projecting and photoprinting a pattern of a first object upon a second object by use of a projection optical system. More particularly, the invention is concerned with a step-and-repeat type projection exposure apparatus which is usable in the manufacture of microcircuits such as integrated circuits and which includes a projection optical system as well as an alignment system for aligning a reticle having a pattern and a wafer having a surface film layer such as a photoresist layer, the apparatus being operable to photoprint, after the reticle-to-wafer alignment, the reticle pattern upon the wafer by the projection through the projection optical system.

The present invention may be related to optical arrangements disclosed in Japanese Laid-Open Patent Applications, Laid-Open Nos. 25638/1983, 53562/1979, 90955/1978 and 52021/1985 all of which were filed in Japan in the name of the assignee of the subject application. Of these related applications, Japanese Laid-Open Patent Application No. 25638/1983 shows an exposure apparatus having a TTL (Through The Lens) alignment system for aligning a reticle and a wafer by way of a projection optical system. Japanese Laid-Open Patent Application No. 53562/1979 shows a basic structure of a photoelectric detecting device for detecting alignment marks provided on a reticle and a wafer. Japanese Laid-Open Patent Applications Nos. 90955/1978 and 52021/1985 each shows a photoelectric detecting device for detecting alignment marks provided on a mask or reticle and a wafer while avoiding adverse effects of a photoresist layer, formed on the surface of the wafer, upon detection of the mark.

In the projection exposure apparatus for use in the field of manufacture of microcircuits, the resolving power and the superimposing accuracy are two basic performances required. As for the resolving power, it only needs very simple treatment because only a few parameters determine the resolving power. In the projection exposure apparatuses, called "steppers", used in the field of manufacture of semiconductor devices, it is easy to estimate the resolving power of a projection lens system once the numerical aperture (NA) and the wavelength to be used for the photoprinting through the projection lens system are determined. Also, in a case of X-ray exposure apparatuses, there are only a limited number of parameters such as "half shade" which is determined by the size of an X-ray source used.

In the field of semiconductor devices, the progress of the devices in the points of high capacities and further miniaturization mainly owes to the advance of the photolithography technique (i.e. the technique of printing a pattern of a very narrow linewidth) and to the advance of the process technique such as the etching process technique. As regards the resolving power, the history of projection lens systems used in the steppers shows the fact of steady advance of the resolving power. Recently, the minimum resolvable linewidth has become less than 1 micron which was a deadlock in the past, and a variety of lens systems having resolution of an order of submicron linewidth have been developed.

On the side of the wafer process, there have recently been proposed various ideas such as a trenching process, a low-step structure, a high-step structure or the like. Briefly, these ideas are in the trend of developing three-dimensional integrated-circuits.

The advance of the resolving power having been achieved on the exposure apparatus side and the advance having been achieved on the process technique side come into intimate contact with each other, on the same stage of pattern superimposition. In this respect, the superimposing accuracy has become more and more important in the exposure apparatus.

It is difficult to treat the superimposing accuracy in terms of simple parameters such as those with which the resolving power can be treated. This is just the implication of the variegation of the wafer process. On the other hand, this is because of the multifariousness of the structures of alignment systems used for the superimposition. What makes the factors of the wafer process more complicated is the fact that the problem should be discussed not only in the phase of a wafer substrate but also in the phase of a photoresist coating applied to the wafer surface. One of the targets which are currently and apparently aimed at in the field of semiconductor devices is a three-dimensionally constructed integrated-circuit. To go in such trend, it is inevitable to make the surface step (recess/protrusion) of the wafer much deeper or higher. Clearly, this adversely affects the state of resist coating. Also, there is a tendency to further enlargement of the wafer size, i.e., from 6-inch wafers to 8-inch or 10-inch wafers. Where a large-diameter wafer is coated with a photoresist material in accordance with the drop-and-spin method, apparently the state of coating is uneven between a central portion and a peripheral portion of the wafer. Also, the unevenness grows with the increase in the depth/height of the surface recess/protrusion of the wafer. In fact, it is known that the state of alignment changes due to the influence of the application of the resist material to the wafer. The importance will be understood from the fact that studies have been made of how to uniformly apply the resist material.

Further, with regard to the photoresist, consideration has to be made of a tendency to using a multilayer resist in accordance with the "age" of submicron linewidth. Since, in a few manufacturing processes, some measures such as the aforementioned multilayer resist process or the contrast enhancement lithography (CEL) technique must be inevitably adopted in order to improve the resolving power, it is also necessary to arrange the exposure apparatus so as to meet them. It can be said that, in the phase of the pattern superimposition, it is required to provide the exposure apparatuses with effective measures for such newly proposed wafer processes as described above.

On the other hand, the multifariousness of the alignment systems is an evidence of the flexibility and hardness of constructing the system. Every alignment system having been proposed or developed has a difference from the others, and each system has its own advantage and disadvantage. An example is found in an alignment system of a projection exposure apparatus of the type disclosed in Japanese Laid-Open Patent Application, Laid-Open No. 25638/1983. This is an example of excellent arrangement which practically embodies a so-called TTL (through the lens) on-axis alignment system with the aid of a projection lens optical system that is telecentric both on the reticle side and on the wafer side. While the projection lens system is arranged so that aberrations are corrected with respect to g-line rays (436 nm in wavelength), it shows substantially the same optical performance with respect to a He-Cd laser beam (442 nm in wavelength). The proposed alignment system uses the laser beam scanning method, using the He-Cd laser beam, for the detection of alignment signals. For this reason, the exposure operation can be initiated just in the state of completion of the alignment. Namely, the TTL on-axis alignment is practically embodied. The TTL on-axis alignment system is nearly idealistic in a sense that the error in the detection of the alignment signals is the sole factor of the inaccurate operation of the exposure apparatus. Only one weak point is that the signal detection is not easy when the system is used with a resist material, such as the multilayer resist, having an absorbency with respect to wavelengths near that to be used for the photoprinting.

On the other hand, many proposals have been made of alignment systems using a wavelength other than the photoprinting wavelength, more particularly using a longer wavelength such as that of e-line rays (546 nm) or that of a He-Ne laser beam (633 nm). Because of the use of the wavelength longer than the photoprinting wavelength, these alignment systems are reliable, for the wafer process using absorptive resist materials such as the multilayer resist. However, due to various aberrations of the projection lens system caused in relation to the "chromaticity", the position that allows detection of a wafer alignment mark by way of the projection lens system (in other words, the position in the image height direction related to the projection lens system) is usually fixed. Therefore, while it depends on the positional relation of the alignment mark with an associated shot area of the wafer, it is necessary to move the wafer after the mark is detected, so as to move the associated shot area to the exposure position. Such movement leads to a factor of inaccuracy.

However, recent demands for the superimposing accuracy are very strict. Even the above-described signal detection error which is the sole factor of inaccuracy in the idealistic alignment system of the type described in the aforementioned Japanese Patent Application, Laid-Open No. 25638/1983, has to be treated as a problem.

The inventors of the subject application have made an analysis upon the components of the error in the detection of the alignment signal and, from the results, it has been found that almost all the error components result chiefly from the application of the photoresist to the wafer surface. While there are many factors of inaccuracy related to the resist coating, it is considered that the most important factors are the following two:

The first is the effect of interference between the light reflected by the surface of the resist layer and the light passed through the resist layer and reflected backwardly from the substrate of the wafer. Particularly, as described hereinbefore, the application of the photoresist material to the wafer is not always uniform. In many cases, the resist coating is uneven between the central portion and the peripheral portion. Also, the wafer substrate itself involves a problem of unevenness resulting from the working processes such as the etching, the sputtering, etc. As a consequence, the structures of respective alignment marks associated with different shot areas on the wafer, when they are considered on the condition that the resist coating is existing on the wafer, are different from each other (the variation occurring with the difference in the location on the wafer). Accordingly, the effect of interference varies with the location on the wafer. It appears therefrom that the interference described above is the most striking one of the effects of the resist coating that causes the alignment error.

The second factor is the multiple reflection. The resist layer has, as one character thereof, a function of optical waveguide. For this reason, a portion of the light reflected by the wafer substrate is reflected at the interface between the resist layer and the air. Such portion goes back to the wafer substrate and is reflected thereby again. The higher the reflection factor of the wafer substrate is, the more noticeable the effect of multi-reflection is. Moreover, the multiple reflection finally causes interference which results in further deterioration of the alignment accuracy.

As another factor of inaccuracy resulting from the photoresist, there is the shift of an image due to the refraction by the resist material. However, such factor is merely a secondary factor. It has been confirmed as a result of the analysis that the exclusion of the above-discussed two factors, particularly the effect of interference, is contributive to the improvement of the alignment accuracy, to a great extent.

SUMMARY OF THE INVENTION

Briefly, in the present invention, the error components in the detection of alignment signals are analyzed and the factors causing such error components are obviated. It is accordingly a primary object of the present invention to provide a projection exposure apparatus for projecting a pattern of a first object upon a second object by use of a projection optical system, wherein the alignment detection accuracy is improved significantly.

In accordance with one aspect of the present invention, to achieve the above object, there is provided a projection exposure apparatus which includes an imaging optical system for projecting an image of a pattern of a reticle upon a wafer, and a mark detecting system for detecting an alignment mark formed on the wafer, through a space between the imaging optical system and the wafer.

The detection of the wafer alignment mark through the space between the imaging optical system and the wafer permits a large extent of freedom of geometrical design of the mark detecting system. Particularly, when the mark detecting system is arranged to receive a mark detecting light advancing with an angle larger than the angle of light caused by the surface reflection at the wafer surface and/or the multiple reflection within the surface layer provided on the wafer, the wafer alignment mark can be detected without being affected by the surface layer (photoresist layer) of the wafer, with the result that extraordinarily high alignment accuracy is attained.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is similar to FIG. 1 but shows a projection exposure apparatus according to another embodiment of the present invention.

DESCRIPTION OF THE PREFERRED EMBODIMENTS

Figure 1:
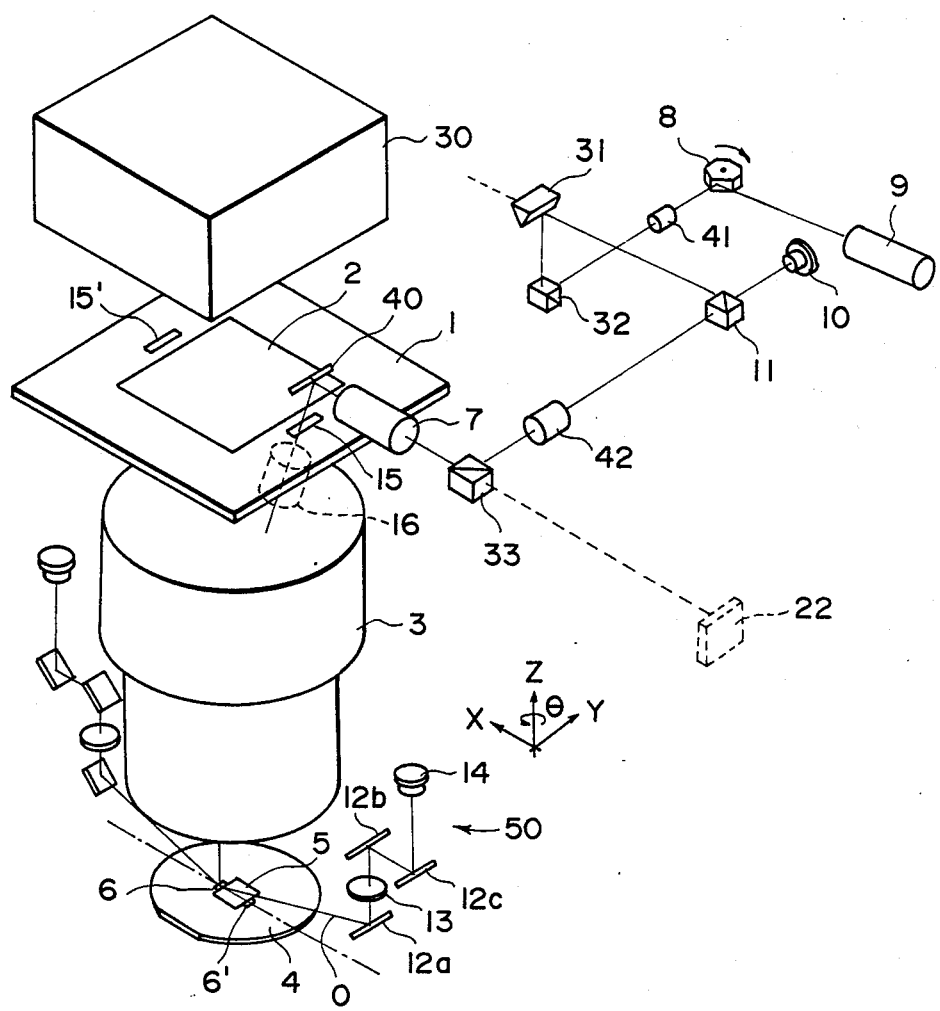
FIG. 1 is a perspective view schematically showing a major portion of a step-and-repeat type projection exposure apparatus according to one embodiment of the present invention.

Referring first to FIG. 1, there is shown a step-and-repeat type reduction projection exposure apparatus, called "stepper", to which an embodiment of the present invention is applied.

As shown in FIG. 1, the exposure apparatus includes a reduction projection lens system 3 which is adapted to project, upon a wafer 4, a semiconductor device manufacturing pattern formed in a pattern region 2 on a reticle 1 as the reticle 1 is illuminated with light supplied from an illumination system 30. By this projection, the pattern of the reticle 1 is photoprinted on the wafer 4, which is a workpiece, in a reduced scale. In order to avoid an unpreferable change in the magnification for the pattern projection due to any surface unevenness of the wafer 4 and/or to a focus change resulting from an error in the focus detection or in the focus-controlling position adjustment made in an automatic focusing system (not shown) provided between the projection lens system 3 and the wafer 4, usually the projection lens system 3 is arranged to be telecentric on the wafer 4 side. The wafer 4 includes different surface portions onto which images of the reticle 1 pattern are transferred in sequence, namely in the step-and-repeat manner. In the state as illustrated in FIG. 1, the pattern of the reticle 1 formed in the region 2 thereof is going to be projected upon one, denoted at numeral 5, of the different surface portions (shot areas) of the wafer 4.

A light source 9 produces a light beam which is deflectively reflected by a polygonal mirror 8 rotatable in one direction. The light beam reflected from the polygonal mirror 8 is directed to a triangular prism 31 by way of an f-θ lens 41 and a reflecting block 32 in this order. By the prism 31, the range of scan of the scanningly deflected light beam is separated into a first half and a second half. In one of the first and second halves, the light beam is directed to a beam splitter 11. By this beam splitter 11, the light beam is reflected toward a relay lens 42. The light beam passed through the relay lens 42 is reflected by a reflecting block 33 and, then, passes through an objective lens 7. The light beam from the objective lens 7 is reflected by a mirror 40 so that it is directed to an alignment mark region 15, defined on the reticle 1, to thereby irradiate a reticle alignment mark formed therein. The light beam passed through the region 15 enters the projection lens system 3 by which it is projected upon a mark region 6 defined on the wafer 4 thereby to irradiate a wafer alignment mark formed therein. The light beam irradiating the reticle alignment mark and the wafer alignment mark is scanningly deflected relative to the regions 6 and 15 in the Y-axis direction. In the other half of the scan range, the light beam from the prism 31 is guided by a similar optical arrangement, not shown, to another alignment mark region 15' defined on the reticle 1 and to another alignment mark region 6' defined on the wafer 4 so as to irradiate alignment marks formed in these regions. Similarly, the light beam is scanningly deflected relative to the regions 15' and 6' in the Y-axis direction. It will be understood that the scan of the mark regions 6 and 15 and the scan of the mark region 6' and 15' are carried out in a time-sharing manner.

Figure 3:
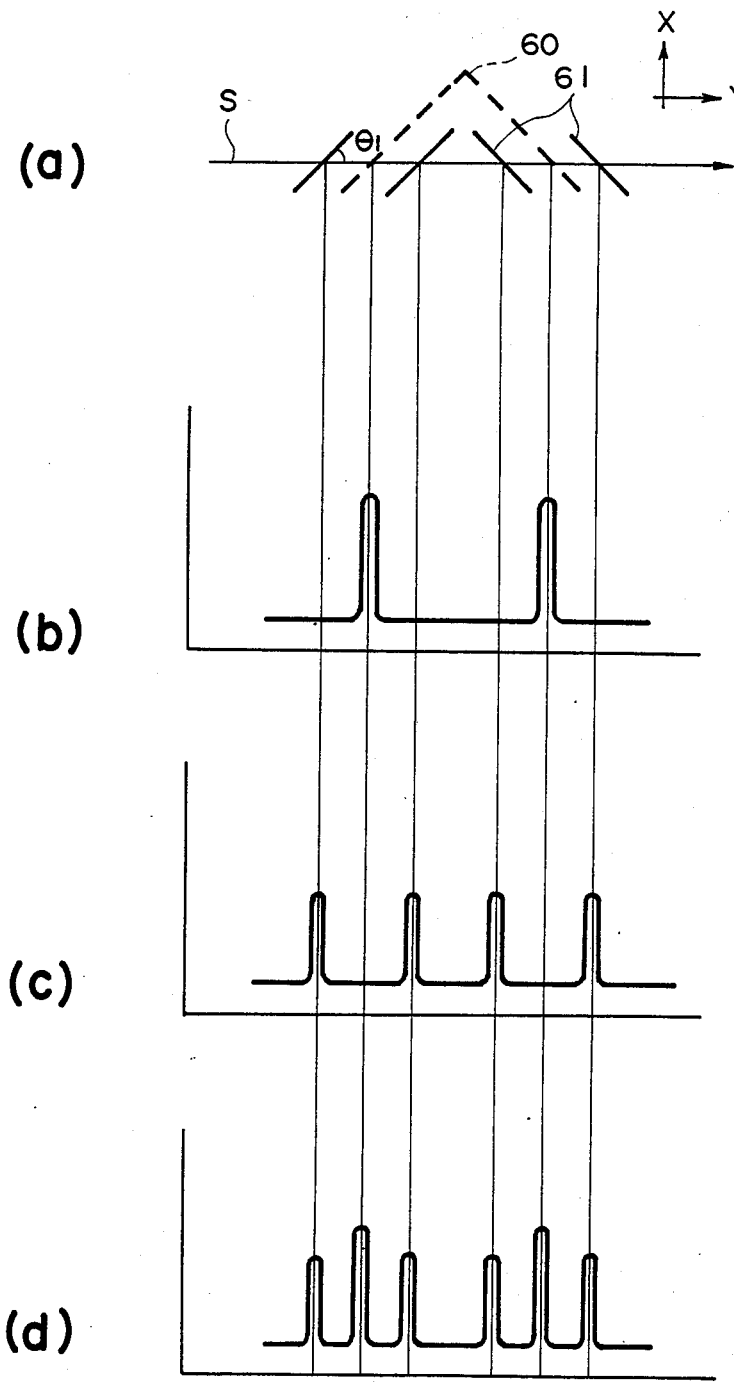
FIG. 3 is a schematic view showing signal waveforms obtainable, in the apparatus of FIG. 1, from alignment marks formed on a reticle and a wafer.

In each of the mark regions 15 and 15' of the reticle 1, there is formed an alignment mark such as shown at 60 in an uppermost part (a) of FIG. 3. On the other hand, in each of the mark regions 6 and 6' of the wafer 4, there is provided an alignment mark such as shown at 61 in the same part of FIG. 3. The reference character S in the part (a) of FIG. 3 depicts the scan direction with the scanningly deflected light beam, which direction coincides with the Y-axis direction.

Figure 8:
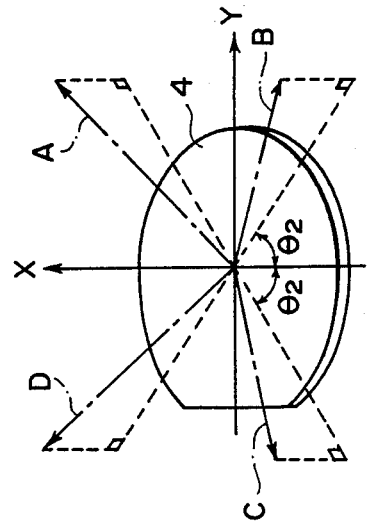
FIG. 8 is a schematic view showing the directions of lights from the wafer surface and to be detected by four mark detecting systems included in the FIG. 1 apparatus.
Figure 9:
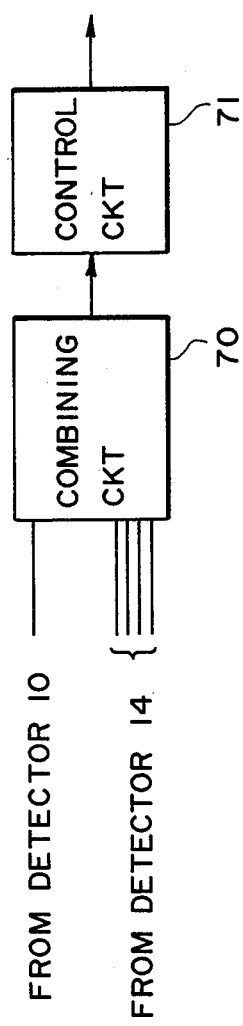
FIG. 9 is a diagrammatic view of a control system included in the FIG. 1 apparatus.

Referring back to FIG. 1, the light which is diffractively reflected by the alignment mark 61 (FIG. 3) in the mark region 6 (6') and which advances outwardly of the projection lens system 3 (generally rightwardly as viewed in FIG. 1) is received by a photoelectric detector 14 with the aid of a mirror 12a, an objective lens 13 and mirrors 12b and 12c. The mirrors 12a–12c, the objective lens 13 and the detector 14 cooperate with each other to constitute a wafer mark signal detecting system 50. A similar wafer mark signal detecting system is provided and illustrated in FIG. 1 so as to detect the light reflected by the wafer alignment mark and advancing generally leftwardly as viewed in FIG. 1. While only two mark signal detecting systems are illustrated, the exposure apparatus of the FIG. 1 embodiment is actually provided with four wafer mark signal detecting systems. This is because of the configuration of the alignment mark provided in the mark region 6 (6'). In a case where the alignment mark used has a single orientation (inclination) with respect to the scan direction S, as compared with the alignment mark shown in FIG. 3, two of the four detecting systems may be omitted. Also, while in FIG. 1 the mark signal detecting system 50 is illustrated as having its optical axis O extended in the X-axis direction as viewed from the above, this is only for ease in illustration. Actually, as is best seen in FIG. 8, each mark-signal detecting system is disposed so that its optical axis extends with an inclination angle $\theta_2$ with respect to the X-axis direction as viewed from the above. This inclination angle $\theta_2$ is determined in accordance with the inclination $\theta_1$ of the alignment mark 61 (FIG. 3) with respect to the scan direction S. As is best seen in FIG. 8, the four mark-signal detecting systems are disposed in the four directions denoted by characters A, B, C and D.

One of the most important features of the present invention resides in the disposition of each wafer signal detecting system 50 provided generally below the projection lens system 3 for detecting the light diffracted by edges of the wafer alignment mark. Particularly, each wafer signal detecting system is disposed so as to detect the mark-diffracted light through a space between the projection lens system 3 and the wafer 4. In the illustration of FIG. 1, alignment marks, such as at 61, provided in relation to the current shot area 5 of the wafer 4 (the area which is going to be exposed to the reticle pattern) are detected by the four wafer signal detecting systems 50 which are disposed in the above-described directional and angular relation with respect to the wafer.

As has been described hereinbefore, the most important factor of the error in the detection of alignment signals is the interference between the light reflected by the surface of the resist layer and the light reflected from the wafer substrate. While the effect of such interference may be removed in some ways, the most fundamental solution is to prevent the light reflected by the resist surface from entering into the wafer signed detecting system. The results of observation of the state of existence of the resist coating on the wafer surface by use of a scan type electron microscope (SEM) or an interference microscope have shown that, even for a wafer having a very large surface step (recess/protrusion), the angle of inclination of the surface of the resist material covering such surface step is, at the maximum, of an order of 5 degrees more or less, and that there is little possibility of existence of a steeper slope. From the viewpoint of step coverage, usually a wafer having a large surface step is coated with a resist layer of a thickness greater than the size (depth or height) of the step (recess/protrusion). For this reason, the surface inclination is held approximately at an order of 5 degrees or slightly more or less.

Figure 2:
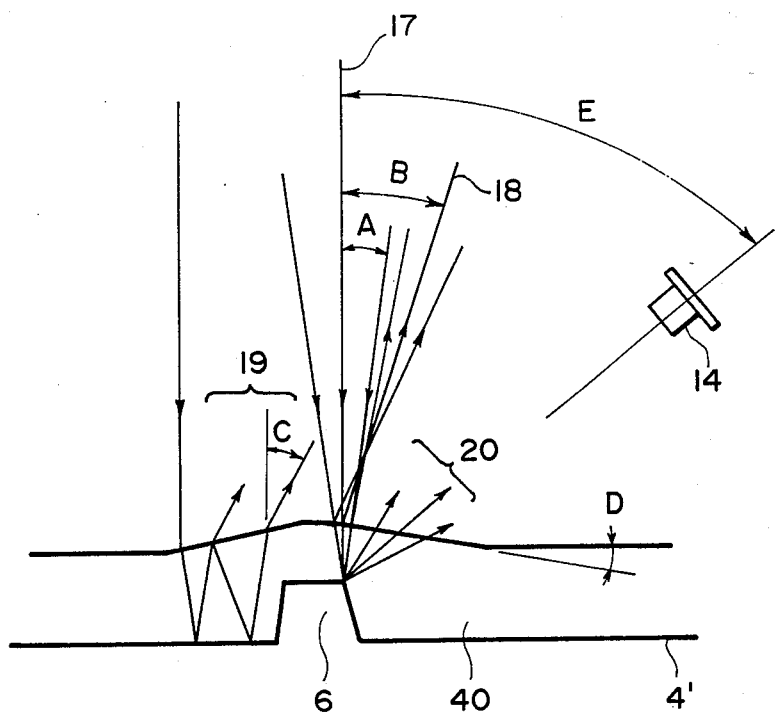
FIG. 2 is a principle view explicating the reflection of a wafer illuminating light at a wafer.

In accordance with the present invention, in consideration of this, a specific condition such as described below is set for each wafer signal detecting system 50. Namely, in FIG. 2, reference character A denotes the angle of expansion of the wafer mark illuminating light 17 emitted from the projection optical system 3 (i.e. the angle of convergence of a light directed from the projection optical system to an edge of the wafer mark); reference character B denotes the angle of expansion of the light reflected by the surface of the resist layer 40; and reference character C denotes the angle of expansion of the light as reflected, twice or more, by the surface 4' of the wafer substrate, these angles being taken with respect to the optical axis of the projection lens system 3. Also, reference character D denotes the inclination angle of the slope of the resist layer 40 in the neighborhood of the mark region 6. Generally, the angle C is larger than the angle B. For example, where the angle D is of an order of 5 degrees and the angle B is approximately 10 degrees, then the angle C is approximately 25 degrees. Further, the light having been multi-reflected by the wafer substrate 4' (i.e. the light having been reflected three or more times or more by the wafer substrate 4') has an intensity which is very low and can be neglected. Thus, in accordance with the present invention, each wafer signal detecting system 50 is arranged so as to satisfy the following condition:

$$E \geq C + A \quad (1)$$

wherein E is the angle set for detecting the light, denoted at 20, as diffractively reflected from the edge of the alignment mark in the mark region 6, namely the angle defined by the optical axis of the detection system 50 with respect to the optical axis of the projection lens system 3.

By satisfying this condition, it is now possible to prevent both the light caused by the reflection at the surface of the resist layer 40 and the light caused by the multiple reflection within the resist layer 40 from entering into the wafer signal detecting system 50. Therefore, each wafer signal detecting system 50 can detect only the light reflected from the wafer alignment mark.

According to the TTL (through the lens) alignment systems employed in conventional step-and-repeat type projection exposure apparatuses, the mark illuminating light is projected upon the wafer through the projection lens system and the light reflected by the wafer is directed to a photodetector by way of the projection lens system. As compared therewith, the mark signal detecting system according to the present invention is specifically arranged so as to detect the light reflected from the wafer alignment mark and advancing outwardly of the projection lens system without passing through the projection lens system. Moreover, a specific limitation "$E \geq C + A$" is set. By this, the detection of the light caused by the reflection at the resist surface and the light caused by the multiple reflection can be avoided. This assures that only the light diffracted by the wafer alignment mark can be separately extracted, and this directly results in significant improvements in the alignment accuracy.

With regard to a reticle signal detecting system, on the other hand, the light beam from the light source 9 is scanningly deflected by the rotatable polygonal mirror 8, whereby the mark region 15 (15') and thus the alignment mark 60 formed in this region are scanned by this light beam. The light reflected or diffracted by the edge of the reticle alignment mark 60 is received by a photoelectric detector 10. Thus, the reticle alignment mark is detected. As described hereinbefore, the scanning beam as transmitted through the reticle 1 and projected by the projection lens system 3 constitutes the light that illuminates the mark region 6 (6') of the wafer 4. The reticle signal detecting system used in the present invention is of a known type such as, typically, disclosed in Japanese Laid-Open Patent Application, Laid-Open No. 53562/1979.

The alignment signal obtainable by the mark detecting systems of the FIG. 1 apparatus will now be described, taken in conjunction with FIG. 3.

As a result of scan of the reticle mark 60 and the wafer mark 61 with the light beam along the scan direction S, a signal such as shown in the part (b) of FIG. 3 is produced by the above-described reticle signal detecting systems (photodetectors 10), and a signal such as shown in the part (c) of FIG. 3 is produced by the wafer signal detecting systems (photodetectors 14). These signals are combined by a signal combining circuit 70 (FIG. 8) and, thereafter, the resultant signal is processed in a known manner by a control circuit 71 (FIG. 8), whereby an alignment signal such as shown in the lowermost part (d) of FIG. 3 is obtainable. In accordance with the thus obtained alignment signal, a driving means (not shown) is actuated so as to relatively move the reticle 1 and the wafer 4 to thereby align them.

According to the present embodiment, as described, a reticle mark signal obtained by receiving the light reflected from the reticle and a wafer mark signal obtained by receiving the light reflected from the wafer without intervention of the projection lens system 3 are combined into an alignment signal. This assures remarkably high alignment accuracy.

In the present embodiment, the light source 9 shown in FIG. 1 is preferably of the type producing a light of a wavelength substantially equal to that of the light emitted from the illumination system 30 for the photoprinting purpose. However, any wavelength of light different from the photoprinting wavelength may of course be used and, in such case, a correcting optical system 16 (FIG. 1) may be used to correct optical aberrations caused in relation to the scanning beam projected upon the wafer 4 by the projection optical system. The correcting optical system 16 may be retracted, if necessary, at the time of projection of the reticle 1 pattern (i.e. the photoprinting). Also, the light source 9 may preferably comprise a laser. However, any one of other types of high-luminance light sources may be used. For example, spectral lines of an Hg lamp may be used.

Referring now to FIG. 4, another embodiment of the present invention will be described. In the FIG. 4 embodiment, the reticle mark signal and the wafer mark signal are detected by use of lights having different wavelengths. For this purpose, there are provided, in addition to the optical arrangement shown in FIG. 1, an additional light source 37 which is adapted to produce light of a wavelength different from that of the light emitted from the light source 9; photoelectric detectors 35 for detecting the light emitted from the additional light source 37 and reflected by the wafer alignment mark; and beam splitters 34 and 36. An aberration correction optical system 16 is made movable so as to be retractably introduced in accordance with the wavelength used. Of course, three or more kinds of wavelengths may be used with a similar optical arrangement. In the present embodiment, one or more wavelengths can be used as the alignment light in accordance with the state of the wafer 4 surface. Therefore, excellent alignment signals are constantly obtainable, independently of the wafer process conditions.

Figure 5:
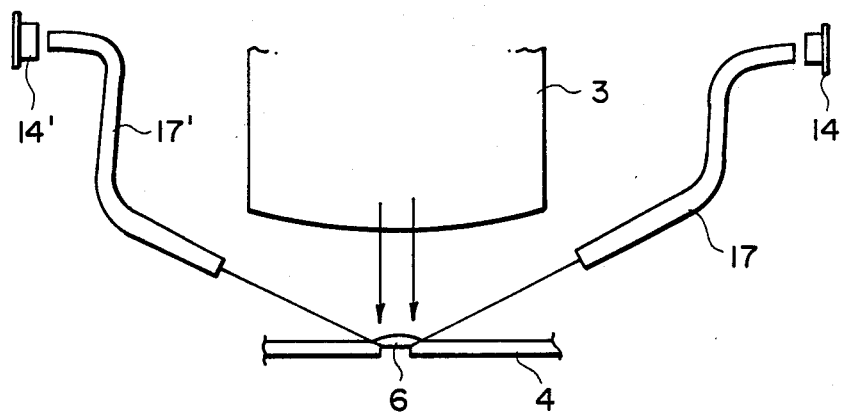
FIG. 5 is a schematic side view showing a major portion of a projection exposure apparatus according to a further embodiment of the present invention.

FIG. 5 shows a further embodiment wherein optical fibers 17 and 17' are used in place of the mirrors 12a-12c and the lenses 13 of the FIG. 1 embodiment, in order to guidingly direct, to the photodetectors 14 and 14', the light diffracted by the edges of the mark formed in the region 6 of the wafer 4. This arrangement facilitates the incorporation of the wafer detecting optical systems into the exposure apparatus as well as reduces the manufacturing cost of the detecting optical systems.

Figure 6:
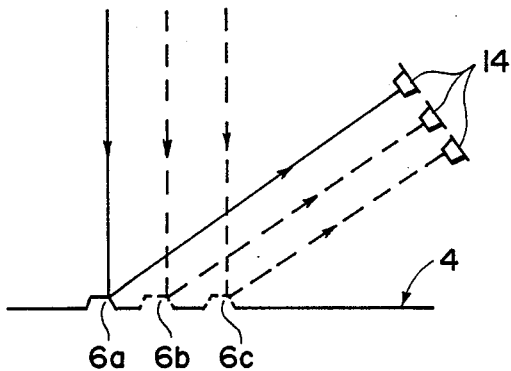
FIGS. 6 and 7 are schematic views, respectively, showing further examples of photoelectric detection of wafer alignment marks, in accordance with the present invention.
Figure 7:
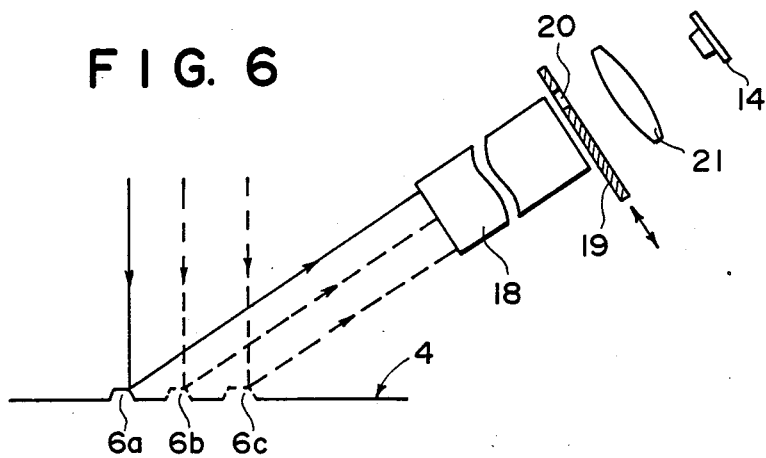

FIGS. 6 and 7 show further embodiments of the present invention, respectively, wherein the mark detecting position on the wafer 4 surface is made changeable. Generally, the reticle patterns used for the manufacture of semiconductor devices do not have the same configuration but have different shapes and sizes. For this reason, the position of the mark region 6 (6') is changeable with the reticle used. In order to meet this, it will be desirable to make the mark detecting position changeable. In the FIG. 1 embodiment, the wafer signal detecting system may be made mechanically movable. However, each of the embodiments shown in FIGS. 6 and 7 easily assures the change of the mark detecting position.

In the FIG. 6 example, the wafer alignment mark may be formed at any one of mark positions 6a, 6b and 6c. The wafer signal detecting system includes photoelectric detectors 14 each of which is disposed so as to satisfy the condition (1). Under the influence of a control system, not shown, one of the photodetectors 14 is selected in accordance with the mark position used.

In the FIG. 7 example, the wafer signal detecting system includes an image guide 18 which comprises a bundle of optical fibers. A movable shutter 19 having a window 20 is disposed adjacent to an end face of the image guide 18. By means of a control system, not shown, the position of the window 20 of the shutter 19 is selected so that the light from the image guide 18 is directed to a photoelectric detector 14 by way of a condensing lens 21. Of course, the mechanically movable shutter 19 may be replaced by shutter means, such as a liquid crystal device, which utilizes an electrooptic effect.

In the foregoing embodiments, each wafer signal detecting system is disposed so that its optical axis extends perpendicularly to corresponding two of bar-like elements that constitute the wafer mark 61 shown in FIG. 3.

As for the photodetector 14, it is desirable to use a high-sensitivity photodetector. This is because the extraction or selection of such rays, of the light diffracted by the edge of the alignment mark, that advance outwardly of the light caused by the surface reflection at the resist surface and the light caused by the multiple reflection within the resist layer, results in a decrease in the intensity of light impinging upon the photodetector. In this respect, use of a high-sensitivity detector such as, for example, a photomultiplier is preferable.

While in the foregoing the description has been made to cases wherein the mark illuminating light is scanningly deflected, the invention is not limited to such cases. That is, the mark can be detected without scanningly deflecting the light beam. In such case, the rotatable polygonal mirror 8 in the FIG. 1 embodiment is replaced by a fixed mirror. In substitution therefore, a wafer stage (not shown) for holding the wafer 4 is moved in the X and Y directions so as to scan the mark regions 6 and 6'. The position of the wafer stage can be measured by a laser interferometer system, not shown. Thus, the position of the wafer stage at a moment at which the alignment mark is detected, is measured by the laser interferometer system. In this case, it is preferable to use an alignment mark comprising bar-like mark elements extending in the X and Y directions, respectively, rather than the alignment mark shown in the part (a) of FIG. 3. Also, in this case, the reticle 1 is aligned indirectly with the wafer signal detecting optical system, by means of a reticle alignment optical system denoted at 22 in FIG. 1 (which is disposed in a determined positional relation with the wafer signal detecting system) and a reticle moving mechanism, not shown. Namely, the wafer 4 is aligned with the wafer signal detecting system with the aid of the laser interferometer system while, on the other hand, the reticle is aligned indirectly with the wafer signal detecting system by means of the reticle aligning optical system. This avoids the necessity of using a high-precision beam scanning system and, therefore, allows simplification of the structure and reduction in the manufacturing cost.

In accordance with the present invention, as has hitherto been described, an alignment signal is obtained first by separately detecting a reticle signal and a wafer signal and second by combining these signals. The wafer signal detecting system is provided between the projection lens system and the wafer and is disposed so as to receive the light diffracted by the wafer alignment mark and advancing with angles larger than the angle of the light caused by the surface reflection and the multiple reflection at the wafer surface. This allows extraordinarily high accuracy alignment of the reticle and the wafer.

While the invention has been described with reference to the structures disclosed herein, it is not confined to the details set forth and this application is intended to cover such modifications or changes as may come within the purposes of the improvements or the scope of the following claims.

What is claimed is:

1. An alignment device for aligning a reticle and a wafer, usable in a projection exposure apparatus which projects and photoprints a pattern of the reticle upon the wafer by use of a projection optical system, said device comprising:
   an illumination system for illuminating the reticle, and for illuminating the wafer through the projection optical system;
   first light-receiving means for receiving light from the reticle to detect an alignment mark of the reticle;
   second light-receiving means for receiving light scattered from the wafer, through a space between the projection optical system and the wafer and without intervention of the projection optical system, to detect an alignment mark of the wafer;
   wherein said second light-receiving means has an optical axis which is disposed so as to satisfy a relation $$E \geq A + C$$

where E is an angle defined between the optical axis of said second light-receiving means and an optical axis of the projection optical system, A is an angle of expansion of light illuminating the wafer and C is an angle of emission of light, with respect to the optical axis of the projection optical system, having been incident upon the surface of the wafer and having been reflected by the wafer surface and by a surface of a photosensitive material applied to the wafer surface and, further, having been reflected again by the wafer surface;
   detecting means for detecting the relative position of the reticle on the wafer on the basis of lights detected by said first and second light-receiving means; and
   means for aligning the reticle and the wafer on the basis of signals from said detecting means.

2. A projection apparatus for projecting a pattern of a reticle on a wafer, said apparatus comprising:
   a projection optical system for projecting the pattern of the reticle upon the wafer;
   means for irradiating the wafer with light by use of said projection optical system;
   means for receiving the light scattered from the wafer, through a space between said projection optical system and the wafer and without intervention of said projection optical system, to detect a mark formed on the wafer; and
   wherein said light-receiving means has an optical axis which is disposed so as to satisfy a relation $$E \geq A + C$$

where E is an angle defined between the optical axis of said light-receiving means and an optical axis of the projection optical system, A is an angle of expansion of light illuminating the wafer and C is an angle of emission of light, with respect to the optical axis of the projection optical system, having been reflected by the wafer surface and by a surface of a photosensitive material applied to the wafer surface and, further, having been reflected again by the wafer surface.

3. An apparatus according to claim 2, wherein said detecting means includes a first photoelectric detector for detecting light advancing from the wafer in a first direction and a second photoelectric detector for detecting light advancing from the wafer in a second direction.

4. An apparatus according to claim 2, wherein said irradiating means includes a plurality of light sources adapted to produce lights which are different in wavelength.

5. An apparatus according to claim 2, further comprising adjusting means for adjusting the position of the wafer in response to a signal from said light-receiving means.

6. An apparatus according to claim 2, wherein said irradiating means includes a laser for producing a light with which the mark of the wafer is irradiated.

7. An apparatus according to claim 6, wherein said irradiating means further includes scanning means for scanning the wafer with the light produced by said laser.

8. An apparatus according to claim 2, wherein said device further includes a movable stage for carrying thereon the wafer and wherein said light receiving-means receives the light scattered from the wafer, during movement of said movable stage.

9. An apparatus according to claim 2, wherein said irradiating means irradiates the wafer with a light having a wavelength different from that of the light used for the projection of the pattern.

10. An apparatus according to claim 9, wherein said irradiating means includes a laser for supplying said light of different wavelengths.

11. A device according to claim 1, wherein said illumination system includes a laser for producing a light with which the reticle and the wafer are illuminated.

12. A device according to claim 11, wherein said illumination system further includes scanning means for scanning the reticle and the wafer with the light produced by said laser.

13. A device according to claim 11, wherein said device further comprises a movable stage for carrying thereon the wafer and wherein said second light-receiving means detects light scattered from the wafer, during movement of said movable stage.

14. A device according to claim 1, wherein said illumination system illuminates the wafer with the light passing through the reticle and wherein said first light-receiving means receives the light reflected by the reticle.

15. A device according to claim 1, wherein said illumination system illuminates the reticle and the wafer by use of a light having a wavelength different from that of a light used for the projection of the pattern.

16. A device according to claim 1, wherein said illumination system illuminates the reticle and the wafer by use of lights having different wavelengths.

* * * * *

UNITED STATES PATENT AND TRADEMARK OFFICE
CERTIFICATE OF CORRECTION

PATENT NO. : 4,834,540
DATED : May 30, 1989
INVENTOR(S) : MASAO TOTSUKA, ET AL.

It is certified that error appears in the above-identified patent and that said Letters Patent is hereby corrected as shown below:

COLUMN 3

Line 11, "idealistic" should read --ideal--.
Line 41, "idealistic" should read --ideal--.

COLUMN 5

Line 1, "principle" should read --principal--.

COLUMN 6

Line 16, "mark region 6' and 15'" should read --mark regions 6' and 15'--.

COLUMN 7

Line 15, "wafer signed" should read --wafer signal--.
Line 53, "or more" (second occurrence) should be deleted.

UNITED STATES PATENT AND TRADEMARK OFFICE
CERTIFICATE OF CORRECTION

PATENT NO. : 4,834,540
DATED : May 30, 1989
INVENTOR(S) : MASAO TOTSUKA, ET AL.     Page 2 of 2

It is certified that error appears in the above-identified patent and that said Letters Patent is hereby corrected as shown below:

COLUMN 9

Line 60, "of mark" should read --of the mark--.

COLUMN 10

Line 31, "therefore," should read --therefor,--.

Signed and Sealed this

Thirteenth Day of March, 1990

Attest:

JEFFREY M. SAMUELS

Attesting Officer    Acting Commissioner of Patents and Trademarks